(12) United States Patent
Toshima et al.

(10) Patent No.: US 8,206,785 B2
(45) Date of Patent: Jun. 26, 2012

(54) CAP METAL FORMING METHOD

(75) Inventors: Takayuki Toshima, Kumamoto (JP);
Mitsuaki Iwashita, Yamanashi (JP);
Takashi Tanaka, Yamanashi (JP);
Yusuke Saito, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 600 days.

(21) Appl. No.: 12/405,597

(22) Filed: Mar. 17, 2009

(65) Prior Publication Data

US 2010/0075027 A1 Mar. 25, 2010

(30) Foreign Application Priority Data

Sep. 22, 2008 (JP) ................................ 2008-242755

(51) Int. Cl.
*B05D 1/36* (2006.01)
*B05D 5/00* (2006.01)
*B05D 1/12* (2006.01)
(52) U.S. Cl. ..................... 427/261; 427/123; 427/126.1; 427/256; 427/258; 427/310
(58) Field of Classification Search .................. 427/123, 427/256, 310, 126.1, 258, 261
See application file for complete search history.

(56) References Cited

U.S. PATENT DOCUMENTS 3,718,115 A * 2/1973 Lee ............................... 118/203
2004/0112858 A1 * 6/2004 Yang ............................... 216/23

FOREIGN PATENT DOCUMENTS

JP 2005-200701 A 7/2005

OTHER PUBLICATIONS

Japanese Office action for 2008-242755 dated Jul. 20, 2010.

* cited by examiner

*Primary Examiner* — Mark A Osele
*Assistant Examiner* — Christopher C Caillouet
(74) *Attorney, Agent, or Firm* — Pearne & Gordon LLP

(57) ABSTRACT

A cap metal forming method capable of obtaining a uniform film thickness on the entire surface of a substrate is provided. The method for forming a cap metal on a copper wiring formed on a processing target surface of a substrate includes: holding the substrate so as to be rotatable; rotating the substrate in a processing target surface direction of the substrate; locating an end portion of an agitation member so as to face the processing target surface of a periphery portion of the substrate with a preset gap maintained therebetween; supplying a plating processing solution onto the processing target surface; and stopping the supply of the plating processing solution and moving the agitation member such that the end portion of the agitation member is separated away from the processing target surface of the substrate.

5 Claims, 15 Drawing Sheets

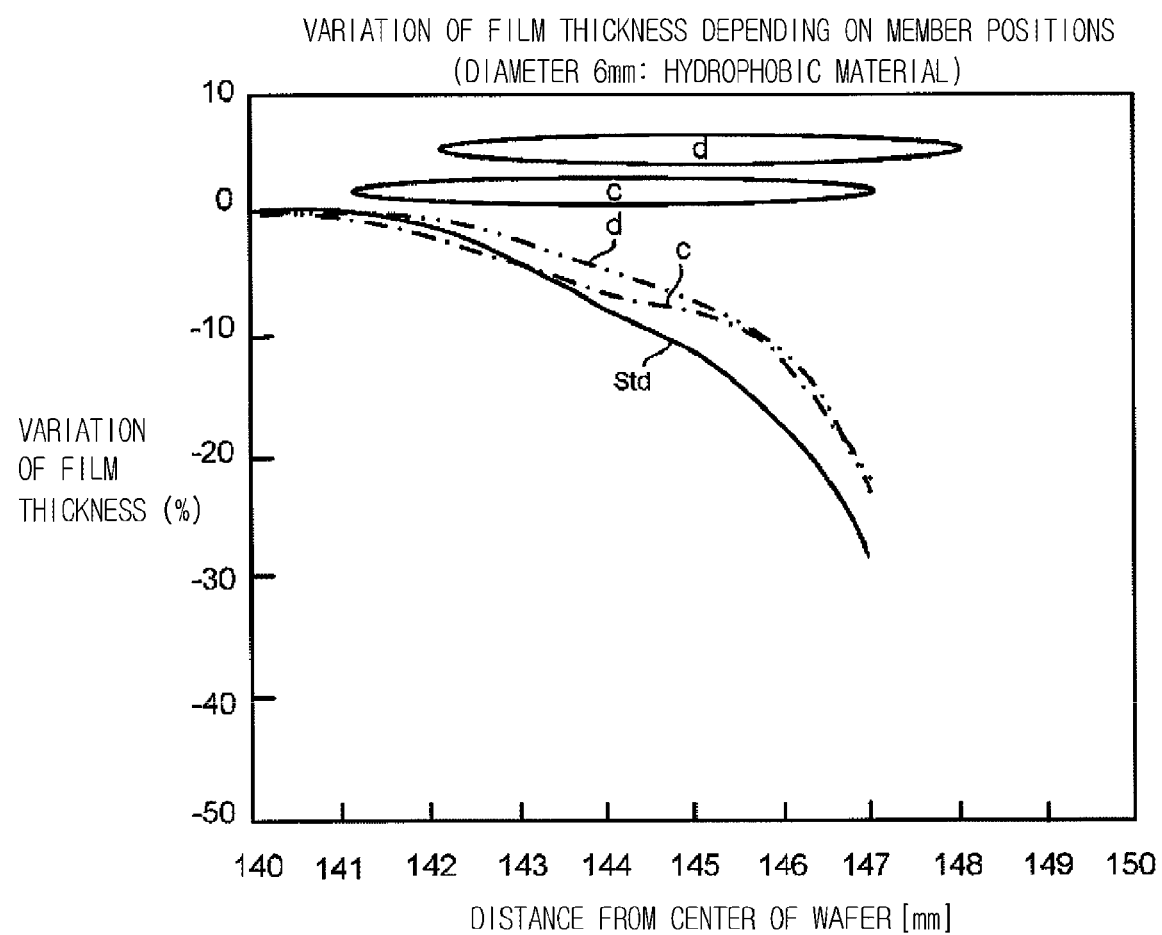

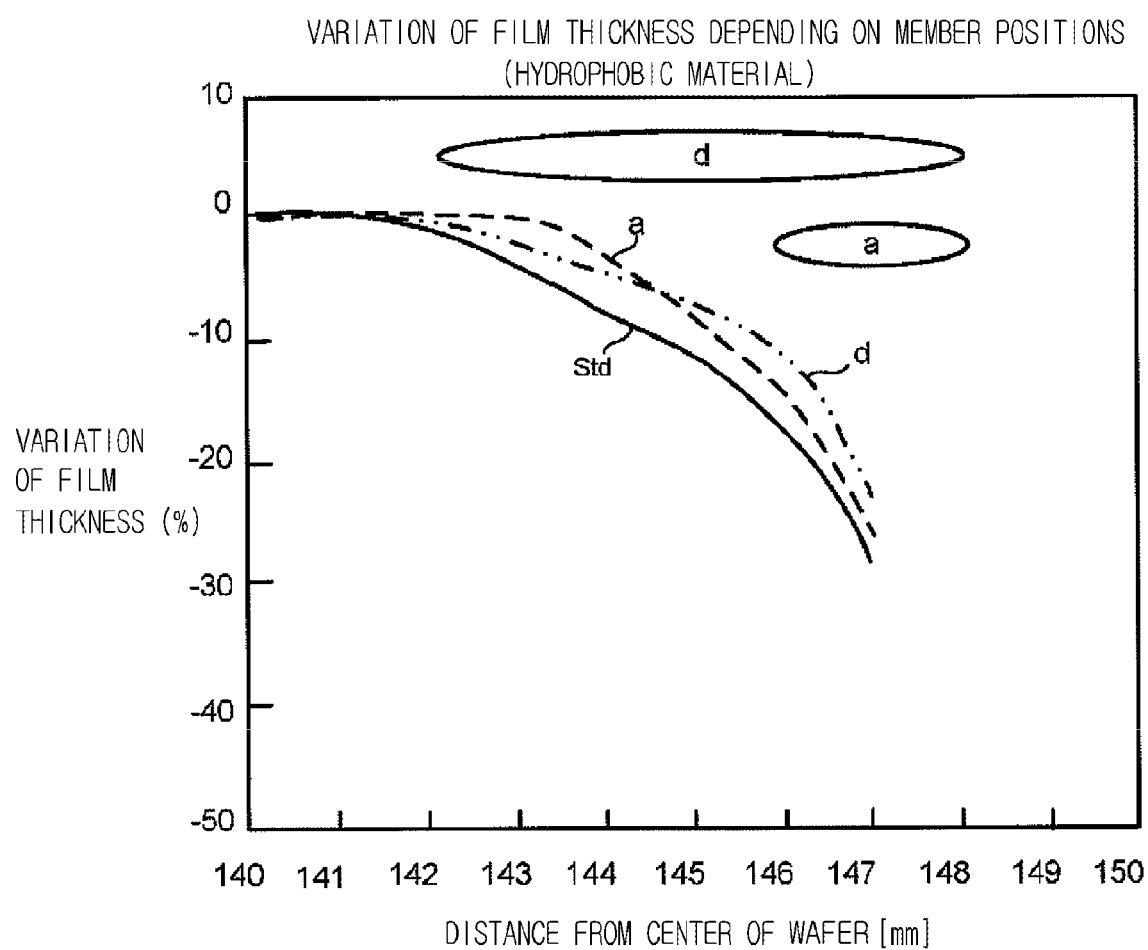

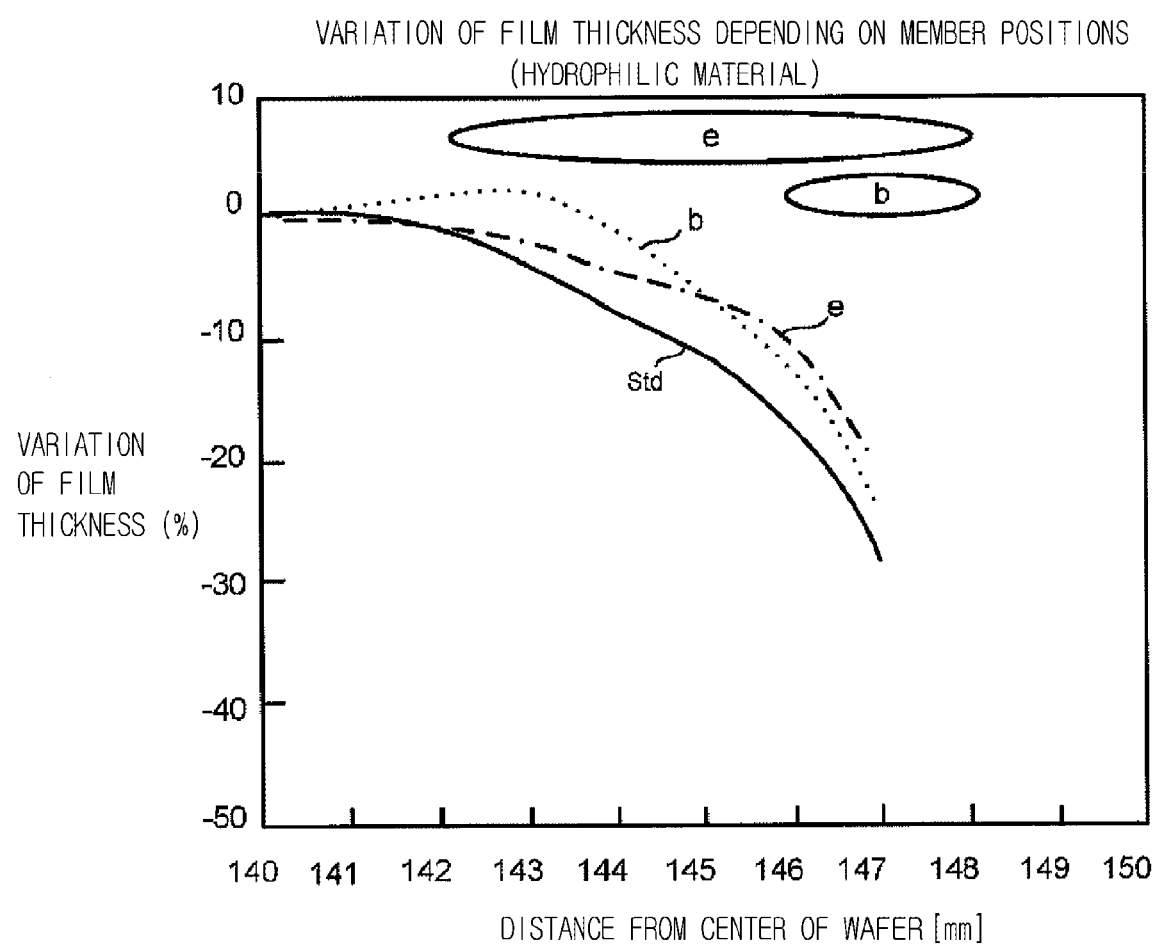

CAP METAL FORMING METHOD

FIELD OF THE INVENTION

The present disclosure relates to a method for forming a cap metal by performing a liquid process such as plating on a target substrate to be processed or the like.

BACKGROUND OF THE INVENTION

In the design and manufacture of a semiconductor device, there has been an increasing demand for a higher operating speed and a higher level of integration. Meanwhile, it has been pointed out that electro-migration (EM) easily occurs due to a current density increase caused by a high-speed operation and wiring miniaturization, whereby wiring disconnection may be caused. This results in deterioration of reliability. For this reason, Cu (copper), Ag (silver) or the like having a low resistivity has been used as a wiring material formed on a substrate of the semiconductor device. Especially, since the copper has a resistivity of about 1.8 μΩ·cm and is expected to exhibit high EM tolerance, it is regarded as a material suitable for achieving the high speed of the semiconductor device.

In general, a damascene method has been utilized to form a copper wiring on the substrate, and this method involves forming a via and a trench on an insulating film by etching, and then filling them with a Cu wiring. Further, there has been made an attempt to enhance the EM tolerance of the semiconductor device by coating a metal film called a cap metal on the Cu wiring by electroless plating by means of supplying a plating solution containing CoWB (cobalt•tungsten•boron), CoWP (cobalt•tungsten•phosphorus), or the like on the surface of the substrate having the Cu wiring (see, for example, Patent Document 1).

The cap metal is formed by supplying the electroless plating solution on the surface of the substrate having the Cu wiring. For example, the substrate may be fixed on a rotary support, and by supplying the electroless plating solution while rotating the rotary support, a uniform liquid flow is generated on the substrate surface, whereby a uniform cap metal can be formed over the entire substrate surface (see, for example, Patent Document 2).

As for the electroless plating, however, it is known that a precipitation ratio of metal is largely affected by reaction conditions such as the composition and the temperature of the plating solution, and the like. Moreover, there has occurred a problem that by-products (residues) due to the plating reaction are generated in the form of slurry and remain on the substrate surface, impeding the uniform flow of the plating solution and making it impossible to replace the deteriorated electroless plating solution with new one. As a result, the reaction conditions on the substrate become locally different, making it difficult to form a cap metal having a uniform film thickness over the entire surface of the substrate. In addition, the substrate surface on which the cap metal is to be formed becomes to have a locally hydrophilic region or a locally hydrophobic region due to a difference in the surface material or sparseness or denseness of wiring. As a result, the electroless plating solution cannot be supplied onto the entire region of the substrate in a uniform manner, resulting in a failure of forming the cap metal having a uniform film thickness over the entire surface of the substrate.

Patent Document 1: Japanese Patent Laid-open Publication No. 2006-111938

Patent Document 2: Japanese Patent Laid-open Publication No. 2001-073157

BRIEF SUMMARY OF THE INVENTION

As stated above, the conventional plating method has a drawback in that the electroless plating solution cannot be uniformly supplied onto the entire surface of the substrate, thus making it difficult to obtain the uniform film thickness over the entire surface of the substrate.

In view of the foregoing, the present disclosure provides a cap metal forming method capable of forming a cap metal having a uniform film thickness over the entire surface of a substrate.

In accordance with one embodiment of the present disclosure, there is provided a method for forming a cap metal on a copper wiring formed on a processing target surface of a substrate, the method including: holding the substrate so as to be rotatable; rotating the substrate in a processing target surface direction of the substrate; locating an end portion of an agitation member so as to face the processing target surface of a periphery portion of the substrate with a preset gap maintained therebetween; supplying a plating processing solution onto the processing target surface; and stopping the supply of the plating processing solution and moving the agitation member such that the end portion of the agitation member is separated away from the processing target surface of the substrate.

In the method for forming the cap metal, the end portion of the agitation member may be located at a position about 10 mm away from an edge of the substrate. Desirably, the end portion of the agitation member may be located to have the gap smaller than a gap at which the end portion of the agitation member is in contact with the surface of the supplied plating processing solution, and may be made of a hydrophilic material. Further, the end portion of the agitation member may be formed in a circular cross section having a diameter of about 2 mm or greater.

In accordance with the present disclosure, it is possible to provide a cap metal forming method capable of forming a cap metal having a uniform film thickness over the entire surface of a substrate.

BRIEF DESCRIPTION OF THE DRAWINGS

The disclosure may best be understood by reference to the following description taken in conjunction with the following figures:

FIG. 13 offers a diagram for describing a variation of a film thickness depending on the position of the agitating member in accordance with the embodiment of the present disclosure;

FIG. 14 sets forth another diagram for describing a variation of a film thickness depending on the position of the agitating member in accordance with the embodiment of the present disclosure; and FIG. 15 provides still another diagram for describing a variation of a film thickness depending on the position of the agitating member in accordance with the embodiment of the present disclosure.

DETAILED DESCRIPTION OF THE INVENTION

A general electroless plating process includes a pre-cleaning process, a plating process, a post-cleaning process, a rear surface/end surface cleaning process, and a drying process. Here, the pre-cleaning process is a process for hydrophilicizing a wafer to be processed. The plating process is a process for performing plating by supplying a plating solution onto the wafer. The post-cleaning process is a process for removing residues generated by a plating precipitation reaction. The rear surface/end surface cleaning process is a process for removing residues which are generated during the plating process on the rear surface and the end surface of the wafer. The drying process is a process for drying the wafer. Each of these processing steps is implemented by combining a rotation of the wafer, a supply of a cleaning solution or a plating solution onto the wafer, and so forth.

In the plating process in which a processing solution such as the plating solution is supplied onto the substrate, there may be generated a non-uniformity in the film thickness of a film (plated film) generated by the plating process due to a variation of a processing solution supply, or the like. Especially, in case that the substrate has a large size, the non-uniformity of the film thickness becomes conspicuous. A semiconductor manufacturing apparatus in accordance with an embodiment of the present disclosure is designed to solve the problem of film thickness variation•non-uniformity especially in the plating process among each process of the electroless plating process, as well as to improve throughput.

Figure 1:
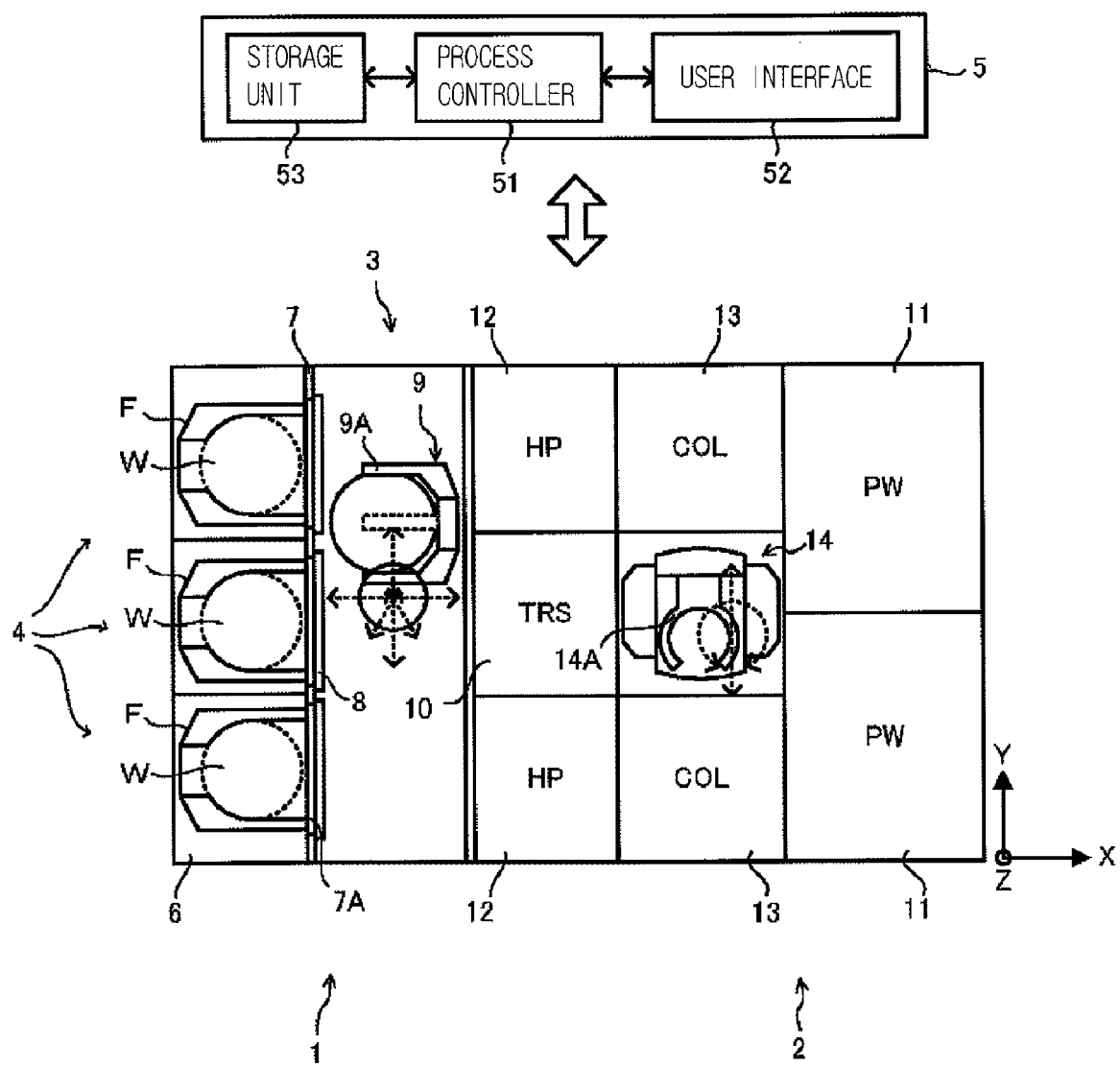
FIG. 1 provides a plane view illustrating a configuration of a semiconductor manufacturing apparatus in accordance with an embodiment of the present disclosure.

Hereinafter, the embodiment of the present disclosure will be described in detail with reference to the accompanying drawings. FIG. 1 is a plane view showing a configuration of the semiconductor manufacturing apparatus in accordance with the embodiment of the present disclosure, and FIGS. 2 and 3 set forth a cross sectional view and a plane view of an electroless plating unit of the semiconductor manufacturing apparatus in accordance with the embodiment of the present disclosure, respectively. FIG. 4 depicts a schematic view illustrating an arm unit for supplying a plating solution in the electroless plating unit.

As shown in FIG. 1, the semiconductor manufacturing apparatus in accordance with the embodiment of the present disclosure includes a loading/unloading unit 1, a processing unit 2, a conveyance unit 3 and a control unit 5.

The loading/unloading unit 1 is a device for loading and unloading plural substrates W into and out of the semiconductor manufacturing apparatus via FOUPs (Front Opening Unified Pods) F. As shown in FIG. 1, the loading/unloading unit 1 includes three loading/unloading ports 4 arranged in Y direction along the front face (lateral side of X direction of FIG. 1) of the apparatus. Each loading/unloading port 4 has a mounting table 6 for mounting the FOUP F thereon. A partition wall 7 is formed on the rear surface of each gate loading/unloading port 4, and a window 7A corresponding to the FOUP F is formed at the partition wall 7 to be positioned above the mounting table 6. Each window 7A is provided with an opener 8 for opening or closing a lid of the FOUP F. The lid of the FOUP F is opened or closed by the opener 8.

The processing unit 2 is a group of processing units for performing each of the above-described processes on the substrates W sheet by sheet. The processing unit 2 includes a transfer unit TRS 10 for performing a transfer of the substrate W with respect to the conveyance unit 3; electroless plating units PW 11 for performing an electroless plating process and pre- and post-processes therefor on the substrate W; heating units HP 12 for heating the substrate W before and after the plating process; cooling units COL 13 for cooling the substrate W heated by the heating units 12; and a second substrate transfer mechanism 14 disposed in a substantially center portion of the processing unit 2 while being surrounded by the group of these units and serving to transfer the substrate W between the respective units.

The transfer unit 10 includes substrate transfer devices (not shown) vertically arranged in two levels, for example. The upper and lower substrate transfer devices can be used complementarily depending on the purposes of use. For example, the lower substrate transfer device may be used to temporarily mount thereon the substrate W loaded from the loading/unloading port 4, while the upper substrate transfer device may be used to temporarily mount thereon the substrate W to be unloaded back into the loading/unloading port 4.

The two heating units 12 are disposed at locations adjacent to the transfer unit 10 along the Y direction. Each heating unit 12 includes, for example, heating plates vertically arranged in four levels. The two cooling units 13 are disposed at locations adjacent to the second substrate transfer mechanism 14 in the Y direction. Each cooling unit 13 includes, for example, cooling plates vertically arranged in four levels. The two electroless plating units 11 are arranged in the Y direction along the cooling units 13 and the second substrate transfer mechanism 14 located adjacent to them.

The second substrate transfer mechanism 14 includes, for example, two transfer arms 14A vertically arranged in two levels. Each of the upper and lower transfer arms 14A is configured to be movable up and down and rotatable along a horizontal direction. With this configuration, the second substrate transfer mechanism 14 transfers the substrates W between the transfer unit 10, the electroless plating units 11, the heating units 12 and the cooling unit 13 by the transfer arms 14A.

The conveyance unit 3 is a transfer mechanism located between the loading/unloading unit 1 and the processing unit 2 and serving to transfer the substrates W sheet by sheet. A first substrate transfer mechanism 9 for transferring the substrates W sheet by sheet is disposed in the conveyance unit 3. The substrate transfer mechanism 9 includes, for example, two transfer arms 9A vertically arranged in two levels and movable along a Y direction, and it performs a transfer of the substrates W between the loading/unloading unit 1 and the processing unit 2. Likewise, each transfer arm 9A is configured to be movable up and down and rotatable along a horizontal direction. With this configuration, the first substrate transfer mechanism 9 transfers the substrates W between the FOUPs F and the processing unit 2 by the transfer arms 9A.

The control unit 5 includes a process controller 51 having a microprocessor; a user interface 52 connected with the process controller 51; and a storage unit 53 for storing therein computer programs for regulating the operation of the semiconductor manufacturing apparatus in accordance with the present embodiment, and controls the processing unit 2, the conveyance unit 3, and so forth. The control unit 5 is on-line connected with a non-illustrated host computer and controls the semiconductor manufacturing apparatus based on instructions from the host computer. The user interface 52 is an interface including, for example, a key board, a display, and the like, and the storage unit 53 includes, for example, a CD-ROM, a hard disk, a nonvolatile memory or the like.

Now, the operation of the semiconductor manufacturing apparatus in accordance with the present embodiment will be explained. A substrate W to be processed is previously accommodated in a FOUP F. First, the first substrate transfer mechanism 9 takes the substrate W out of the FOUP F through the window 7A and transfers it to the transfer unit 10. Once the substrate W is transferred to the transfer unit 10, the second substrate transfer mechanism 14 transfers the substrate W from the transfer unit 10 to the hot plate of the heating unit 12 by using the transfer arm 14A.

The heating unit 12 heats (pre-bakes) the substrate W up to a preset temperature, to thereby eliminate organic materials attached on the surface of the substrate W. After the heating process, the second substrate transfer mechanism 14 delivers the substrate W from the heating unit 12 into the cooling unit 13. The cooling unit 13 cools the substrate W.

After the completion of the cooling process, the second substrate transfer mechanism 14 transfers the substrate W into the electroless plating unit 11 by using the transfer arm 14A. The electroless plating unit 11 performs an electroless plating process on a wiring formed on the surface of the substrate W or the like.

After the completion of the electroless plating process, the second substrate transfer mechanism 14 transfers the substrate W from the electroless plating unit 11 to the hot plate of the heating unit 12. The heating unit 12 performs a post-baking process on the substrate W to remove organic materials contained in a plated film (cap metal) formed by the electroless plating as well as to enhance adhesiveness between the plated film and the wiring or the like. After the completion of the post-baking process, the second substrate transfer mechanism 14 transfers the substrate W from the heating unit 12 into the cooling unit 13. The cooling unit 13 cools the substrate W again.

After the completion of the cooling process, the second substrate transfer mechanism 14 transfers the substrate W to the transfer unit 10. Then, the first substrate transfer mechanism 9 returns the substrate W mounted on the transfer unit 10 back into a preset position in the FOUP F by using the transfer arm 9A.

Afterwards, these series of processes are consecutively performed on a plurality of substrates. Further, it may be possible to previously process a dummy wafer at an initial stage and then to facilitate the stabilization of a processing state of each unit. As a result, reproducibility of the process can be improved.

Figure 2:
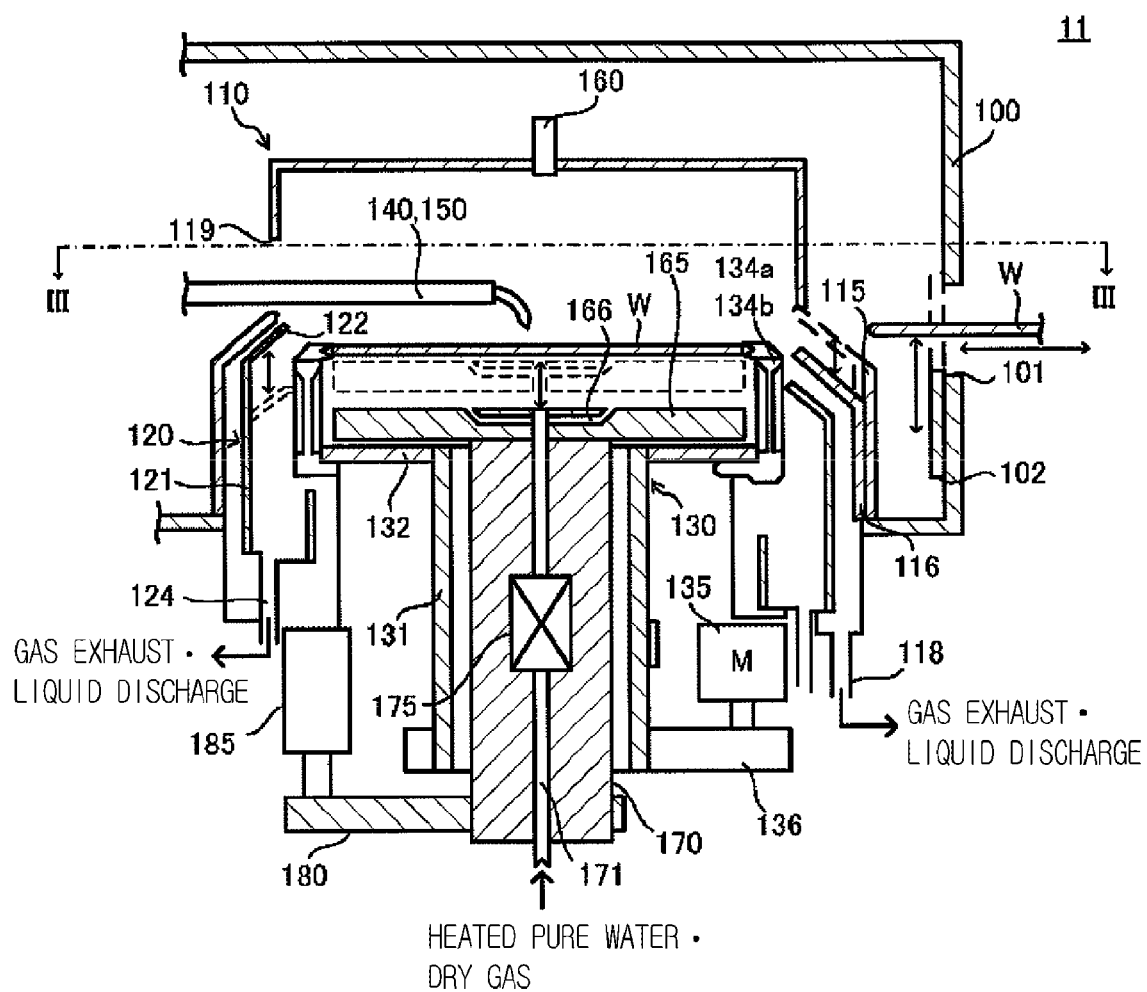
FIG. 2 sets forth a cross sectional view of an electroless plating unit of the semiconductor manufacturing apparatus in accordance with the embodiment of the present disclosure.

Subsequently, the electroless plating unit 11 of the semiconductor manufacturing apparatus in accordance with the present embodiment will be explained in detail in conjunction with FIGS. 2 to 4. As shown in FIG. 2, the electroless plating unit 11 (hereinafter, simply referred to as a "plating unit 11") includes an outer chamber 110, an inner chamber 120, a spin chuck 130, a first and a second fluid supply unit 140 and 150, a gas supply unit 160, a back plate 165.

The outer chamber 110 is a processing vessel installed inside a housing 100, for performing the plating process therein. The outer chamber 110 is formed in a cylinder shape to surround an accommodation position of the substrate W and is fixed on the bottom surface of the housing 100. Installed at a lateral side of the outer chamber 110 is a window 115 through which the substrate W is loaded and unloaded, and the window 115 is opened or closed by a shutter mechanism 116. Further, an openable/closable shutter mechanism 119 for operating the first and second fluid supply units 140 and 150 is installed at a lateral side of the outer chamber 110 facing the window 115. Moreover, a gas supply unit 160 is installed on the top surface of the outer chamber 110, and a drain unit 118 for discharging a gas, the processing solution or the like is provided at a lower portion of the outer chamber 110.

The inner chamber 120 is a vessel for receiving therein the processing solution dispersed from the substrate W, and it is installed inside the outer chamber 110. The inner chamber 120 is formed in a cylinder shape between the outer chamber 110 and the accommodation position of the substrate W, and it includes a drain unit 124 for the discharge of a gas or a liquid. The inner chamber 120 is configured to be movable up and down inside the outer chamber 110 by a non-illustrating elevating mechanism such as a gas cylinder or the like. Specifically, the end of its upper end portion 122 is moved up and down between a position (processing position) slightly higher than the accommodation position of the substrate W and a position (retreat position) lower than the processing position. Here, the processing position is a position where the electroless plating process is performed on the substrate W, and the retreat position is a position where the loading/unloading of the substrate W, cleaning of the substrate W or the like is performed.

The spin chuck 130 is a substrate fixing mechanism for holding the substrate W thereon in a substantially horizontal manner. The spin chuck 130 includes a rotary cylinder body 131; an annular rotary plate 132 horizontally extended from the upper end of the rotary cylinder body 131; supporting pins 134a installed at an outer peripheral end of the rotary plate 132 at a same distance, for supporting the outer periphery portion of the substrate W; and pressing pins 134b for pressing the outer peripheral surface of the substrate W. As illustrated in FIG. 3, the supporting pins 134a and the pressing pins 134b are arranged, for example, in sets of three along the circumferential direction. The supporting pins 134a are fixtures which support and fix the substrate W at the preset position, and the pressing pins 134b are pressing devices which press the substrate W downward. A motor 135 is installed at a lateral side of the rotary cylinder body 131, and an endless belt 136 is wound between a driving shaft of the motor 135 and the rotary cylinder body 131. That is, the rotary cylinder body 131 is rotated by the motor 135. The supporting pins 134a and the pressing pins 134b are rotated in the horizontal direction (planar direction of the substrate W), whereby the substrate W supported by them is also rotated.

The gas supply unit 160 dries the substrate W by supplying a nitrogen gas or clean air into the outer chamber 110. The supplied nitrogen gas or clean air is re-collected via the drain unit 118 or 124 installed at the lower end of the outer chamber 110.

The back plate 165 is installed between the holding position of the substrate W by the spin chuck 130 and the rotary plate 132, facing the bottom surface of the substrate W held on the spin chuck 130. The back plate 165 has a heater embedded therein and is connected with a shaft 170 which penetrates the center of axis of the rotary cylinder body 131. Provided in the back plate 165 is a flow path 166 which is opened at plural positions on the surface thereof, and a fluid supply path 171 is formed to penetrate through the flow path 166 and the center of axis of the shaft 170. A heat exchanger 175 is disposed in the fluid supply path 171. The heat exchanger 175 regulates a processing fluid such as pure water or a dry gas at a preset temperature. That is, the back plate 165 functions to supply the humidity-controlled processing fluid toward the bottom surface of the substrate W. An elevating mechanism 185 such as an air cylinder or the like is connected to a lower end portion of the shaft 170 via a coupling member 180. The back plate 165 is moved up and down between the substrate W held on the spin chuck 130 and the rotary plate 132 by the elevating mechanism 185 and the shaft 170.

Figure 3:
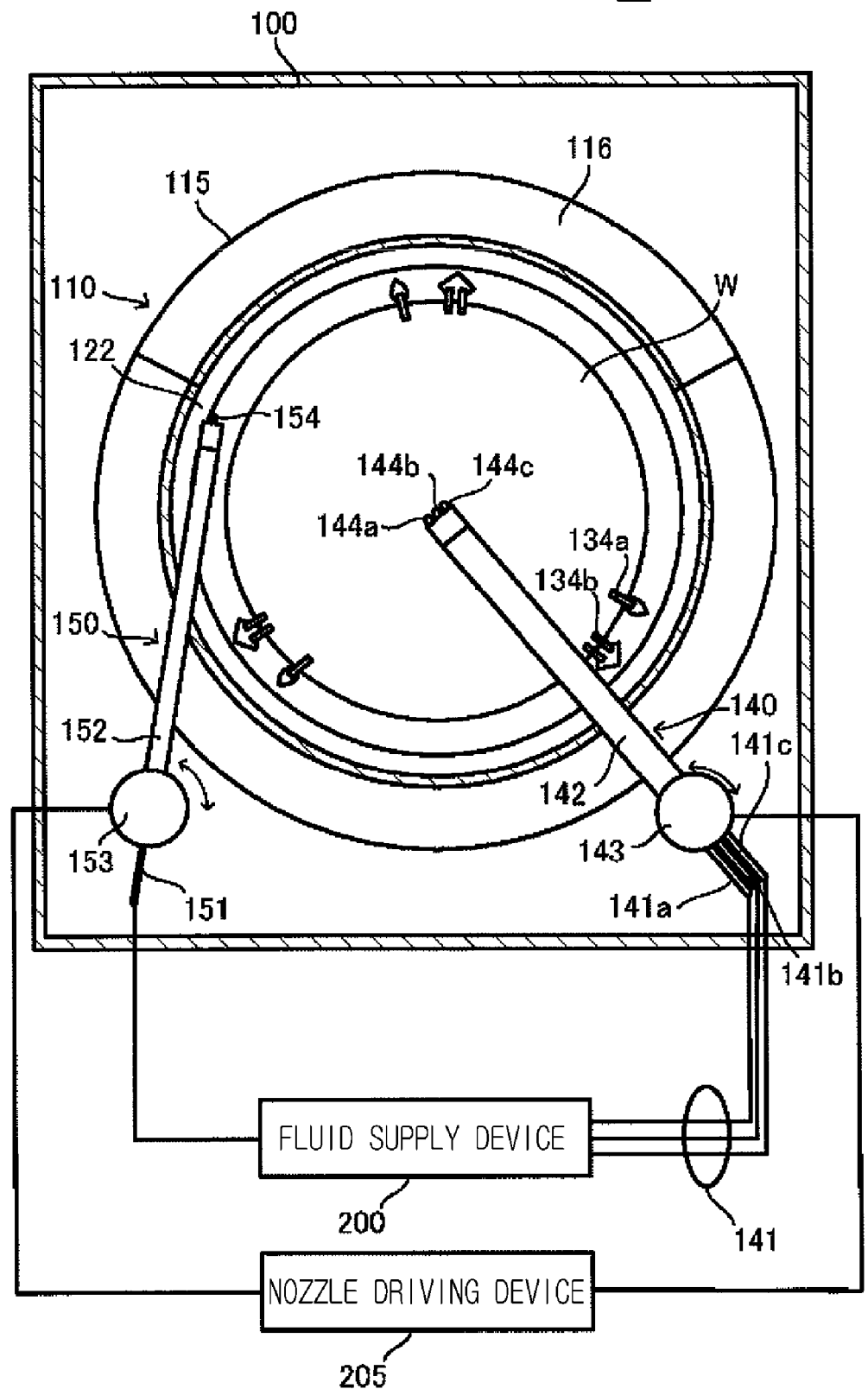
FIG. 3 presents a plane view of the electroless plating unit of the semiconductor manufacturing apparatus in accordance with the embodiment of the present disclosure.
Figure 4:
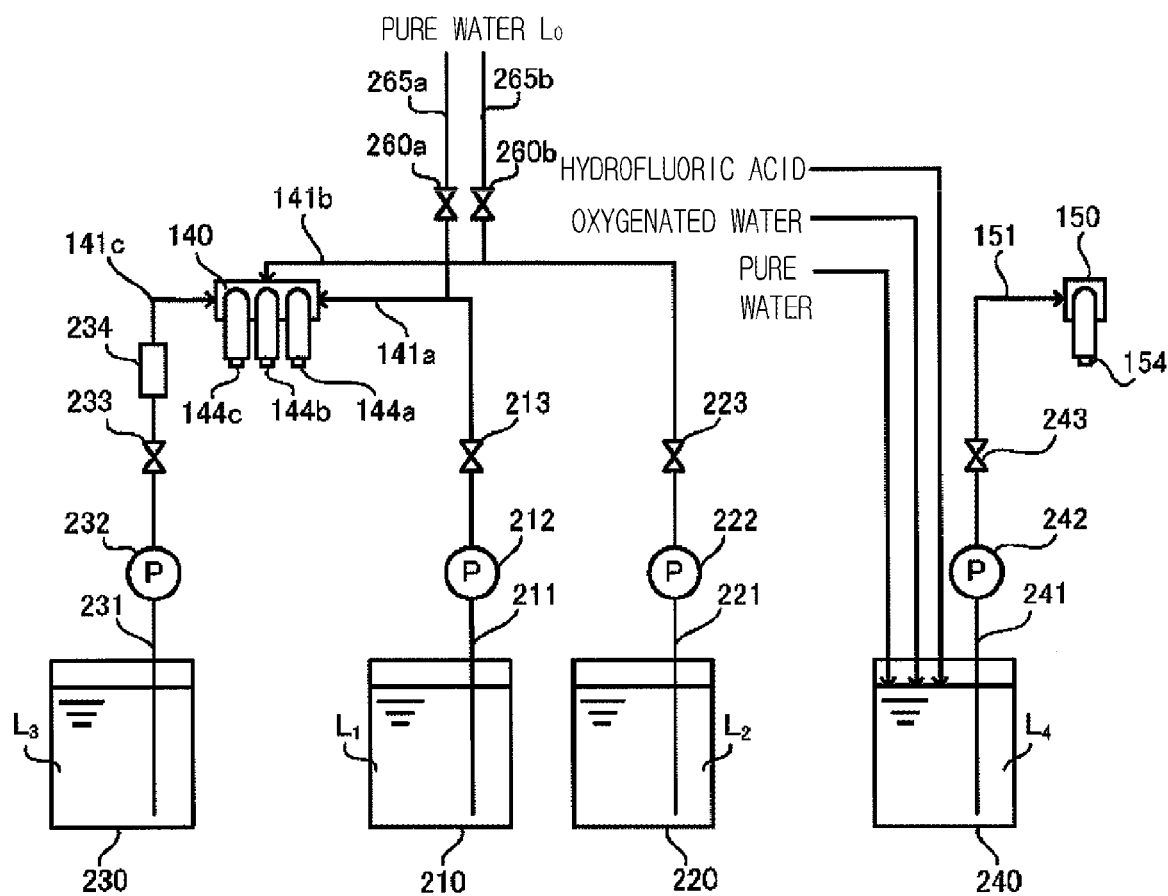
FIG. 4 depicts a schematic view illustrating an arm unit of the electroless plating unit of the semiconductor manufacturing apparatus in accordance with the embodiment of the present disclosure.

As shown in FIG. 3, the first and second fluid supply units 140 and 150 supply the processing solution onto the top surface of the substrate W held by the spin chuck 130. The first and second fluid supply units 140 and 150 have a fluid supply device 200 for storing therein a fluid such as the processing solution; and a nozzle driving device 205 for driving a supply nozzle. Each of the first and second fluid supply units 140 and 150 is installed inside the housing 100 so as to allow the outer chamber 110 to be interposed therebetween.

The first fluid supply unit 140 includes a first pipe 141 connected with the fluid supply device 200; a first arm 142 supporting the first pipe 141; a first rotation driving mechanism 143 for rotating the first arm 142 with respect to a basal end of the first arm 142 by using a stepping motor or the like disposed at that basal end of the first arm 142. The first fluid supply unit 140 has a function of supplying the processing fluid such as the electroless plating processing solution or the like. The first pipe 141 has pipes 141a to 141c for supplying three kinds of fluids individually, and these pipes 141a to 141c are respectively connected with nozzles 144a to 144c at the leading end portion of the first arm 142. In the pre-cleaning process, a processing solution and pure water are supplied from the nozzle 144a; in the post-cleaning process, a processing solution and pure water are supplied from the nozzle 144b; and in the plating process, a plating solution is supplied from the nozzle 144c.

Likewise, the second fluid supply unit 150 includes a second pipe 151 connected with the fluid supply device 200; a second arm 152 supporting the second pipe 151; and a second rotation driving mechanism 153 disposed at the basal end of the second arm 152, for rotating the second arm 152. The second pipe 151 is connected with a nozzle 154 at the leading end portion of the second arm 152. The second fluid supply unit 150 has a function of supplying a processing fluid for processing the outer periphery portion (periphery portion) of the substrate W. The first and second arms 142 and 152 are rotated above the substrate W held on the spin chuck 130 via the shutter mechanism 119 installed in the outer chamber 110.

The second arm 152 has an agitation member 155 (not shown in this figure) installed in the vicinity of the nozzle 154. The agitation member 155 serves to agitate the plaiting solution on the substrate W from the periphery portion of the substrate W when the first fluid supply unit 140 supplies the plating solution.

Here, the fluid supply device 200 will be described in detail with reference to FIG. 4. The fluid supply device 200 supplies the processing fluid to the first and second fluid supply units 140 and 150. As illustrated in FIG. 4, the fluid supply device 200 includes a first tank 210, a second tank 220, a third tank 230 and a fourth tank 240.

The first tank 210 stores therein a pre-cleaning processing solution $L_1$ used for the pre-treatment of the electroless plating process of the substrate W. The second tank 220 stores therein a post-cleaning processing solution $L_2$ used for the post-treatment of the electroless plating process of the substrate W. The first and second tanks 210 and 220 include temperature control mechanisms (not shown) for controlling the temperatures of the processing solutions $L_1$ and $L_2$ at preset temperature levels, and are connected with a pipe 211 coupled with the first pipe 141a and a pipe 221 coupled with the first pipe 141b, respectively. The pipes 211 and 221 are provided with pumps 212 and 222 and valves 213 and 223, respectively. The processing solutions $L_1$ and $L_2$ whose temperatures are controlled at the preset temperature levels are supplied into the first pipes 141a and 141b, respectively. That is, by operating each of the pumps 212 and 222 and the valves 213 and 223, the processing solutions $L_1$ and $L_2$ are transported to the nozzles 144a and 144b via the first pipes 141a and 141b, respectively.

The third tank 230 stores therein a plating solution $L_3$ for use in processing the substrate W. The third tank 230 is connected with a pipe 231 coupled to the first pipe 141c. Installed on the pipe 231 are a pump 232, a valve 233 and a heater (e.g., a heat exchanger 234) for heating the plating solution $L_3$. That is, the temperature of the plating solution $L_3$ is controlled by the heater 234, and the plating solution $L_3$ is transported to the nozzle 144c via the first pipe 141c by the cooperation of the pump 232 and the valve 233. The pump 232 may function as a transporting mechanism, such as a pressurizing mechanism or a force-feed mechanism, for transporting the plating solution $L_3$.

The fourth tank 240 stores therein an outer periphery processing solution $L_4$ for use in processing the outer periphery portion of the substrate W. The fourth tank 240 is connected with a pipe 241 coupled to the second pipe 151. A pump 242 and a valve 243 are installed on the pipe 241. That is, the outer periphery processing solution $L_4$ is sent out into the nozzle 154 via the second pipe 151 by the cooperation of the pump 242 and the valve 243.

Further, a pipe for supplying, e.g., hydrofluoric acid, a pipe for supplying oxygenated water and a pipe for supplying pure water $L_0$ are also connected with the fourth tank 240. That is, the fourth tank 240 also functions to mix these solutions at a preset mixture ratio.

Further, pipes 265a and 265b for supplying pure water $L_0$ are connected with the first pipe 141a and 141b, respectively. A valve 260a is installed on the pipe 265a, and a valve 260b is installed on the pipe 265b. That is, the nozzles 144a and 144b are also capable of supplying the pure water $L_0$.

Figure 5:
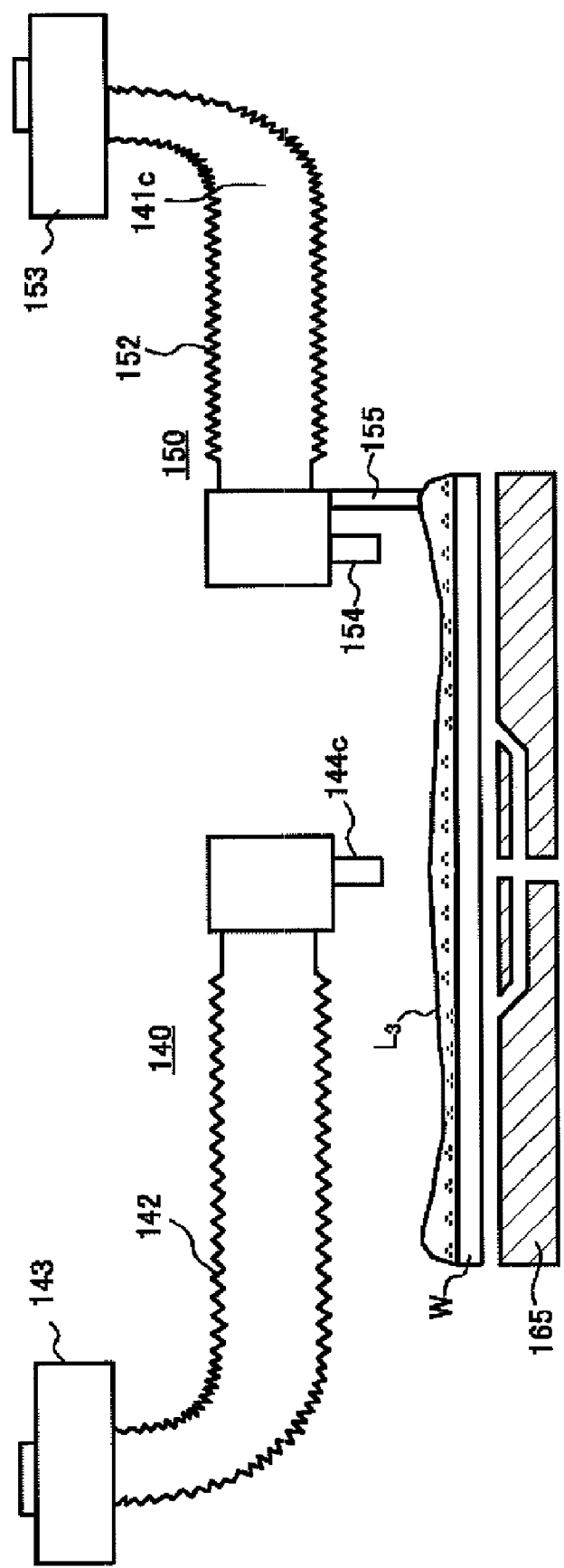
FIG. 5 offers a horizontal view showing a first and a second arm in accordance with the embodiment of the present disclosure.

Now, referring to FIG. 5, the agitation member 155 installed at the second arm 152 will be explained in detail. FIG. 5 is a horizontal view illustrating the first and second arms 142 and 152. As shown in FIG. 5, the agitation member 155 is installed in the vicinity of the nozzle 154 as a leading end portion of the second arm 152. The agitation member 155 is moved to and fixed at a position where its leading end is in contact with the plating processing solution $L_3$ flowing on the periphery portion of the substrate W while the nozzle 144c supplies the plating processing solution $L_3$. That is, the leading end of the agitation member 155 agitates the plating processing solution $L_3$ flowing on the periphery portion of the substrate W, thereby refreshing the plating processing solution $L_3$ on the periphery portion of the substrate W and increasing the amount of heat applied to the periphery portion of the substrate W.

Since the agitation member 155 functions to lift up the surface of the plating processing solution $L_3$ on the periphery portion of the substrate W, it may be desirably made of a hydrophilic material. For example, the agitation member 155 may be formed of Teflon (registered trademark), or the like. Further, since the agitation member 155 needs to come into contact with the surface of the plating processing solution $L_3$, it may desirably have a flat end portion. Likewise, since the agitation member 155 comes into contact with the plating processing solution on the substrate in rotation, the cross section of the agitation member 155 may be desirably formed in a circular shape in order to reduce resistance. Specifically, it can be formed as, for example, a rod-shaped member having a diameter of about 2 mm or greater. Further, since the agitation member 155 needs to be brought into contact with the plating processing solution $L_3$ on the substrate W, the length of the agitation member 155 is set such that the end portion of the agitation member 155 is not in contact with the substrate W while the substrate W is held but comes into contact with the surface of the plating processing solution during the plating process.

During the plating process, the plating solution is supplied from above the processing surface of the target substrate W while the substrate W is being rotated, whereby the plating solution is widely diffused onto the substrate W. However, it is known that a film thickness of a plated film formed on the periphery portion of the substrate W by the plating process becomes relatively thinner (that is, formation of the plated film progresses more slowly) than that of a plated film formed on a central portion of the substrate W, resulting in deteriorating the uniformity of the plating process on a surface of the substrate W.

The delay of the formation of the plated film at the periphery portion of the substrate W may be resulted from non-uniformity of the plating process itself or a variation in plating temperature on the surface of the substrate W. Such non-uniformity or variation is deemed to be caused because the amount of the plating solution on the periphery portion of the substrate W (the amount of the plating solution accumulated on the surface of the substrate W) becomes relatively smaller than that on the central portion of the substrate W, due to a surface tension of the plating solution.

In the plating unit 11 in accordance with the present embodiment, since the plating solution is agitated during the plating process such that the plating solution on the periphery portion of the substrate W becomes thicker, the plated film formation on the surface of the substrate W can be more uniform.

Figure 6:
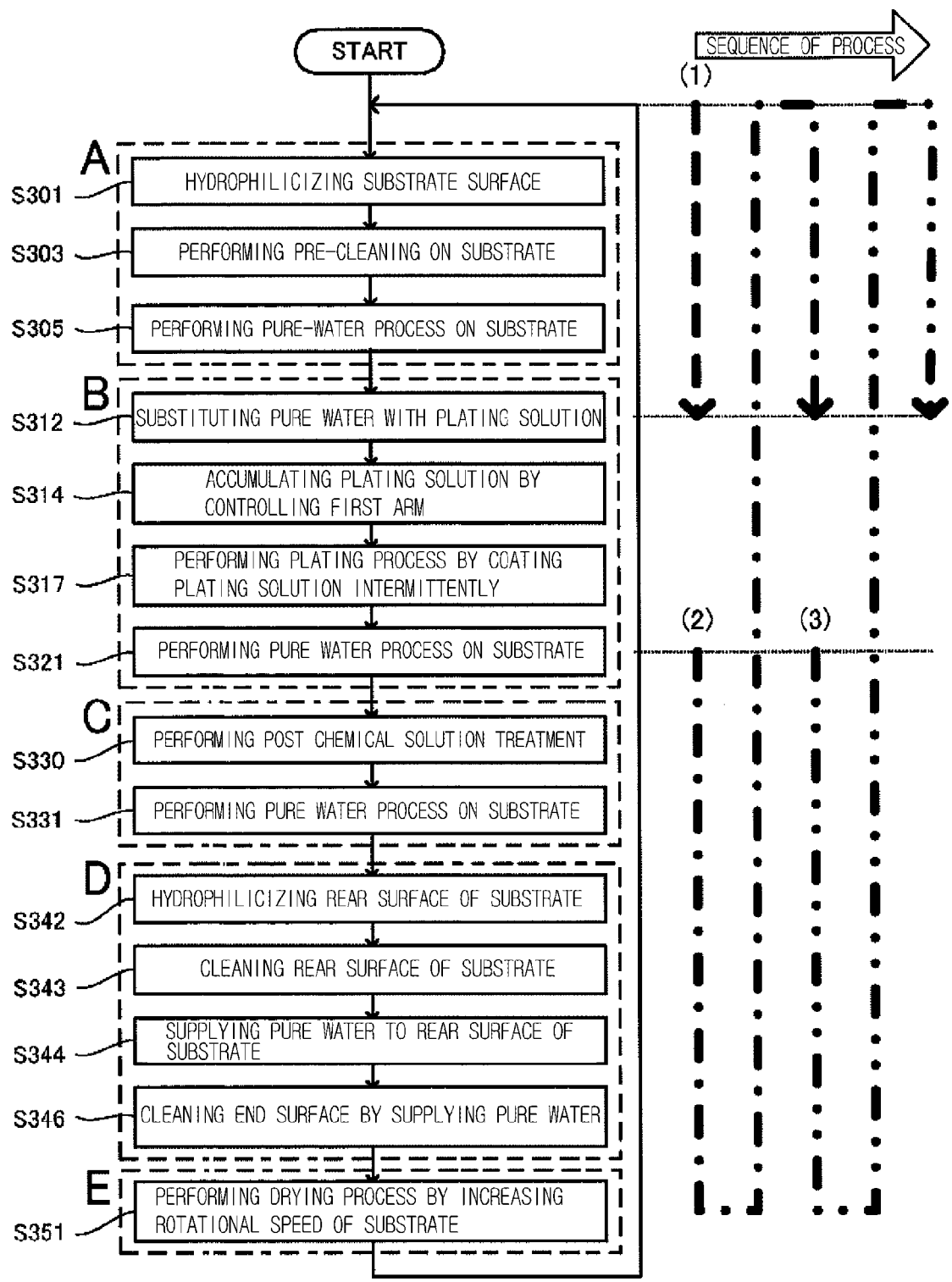
FIG. 6 provides a flowchart to describe an operation of the electroless plating unit in accordance with the embodiment of the present disclosure.
Figure 7:
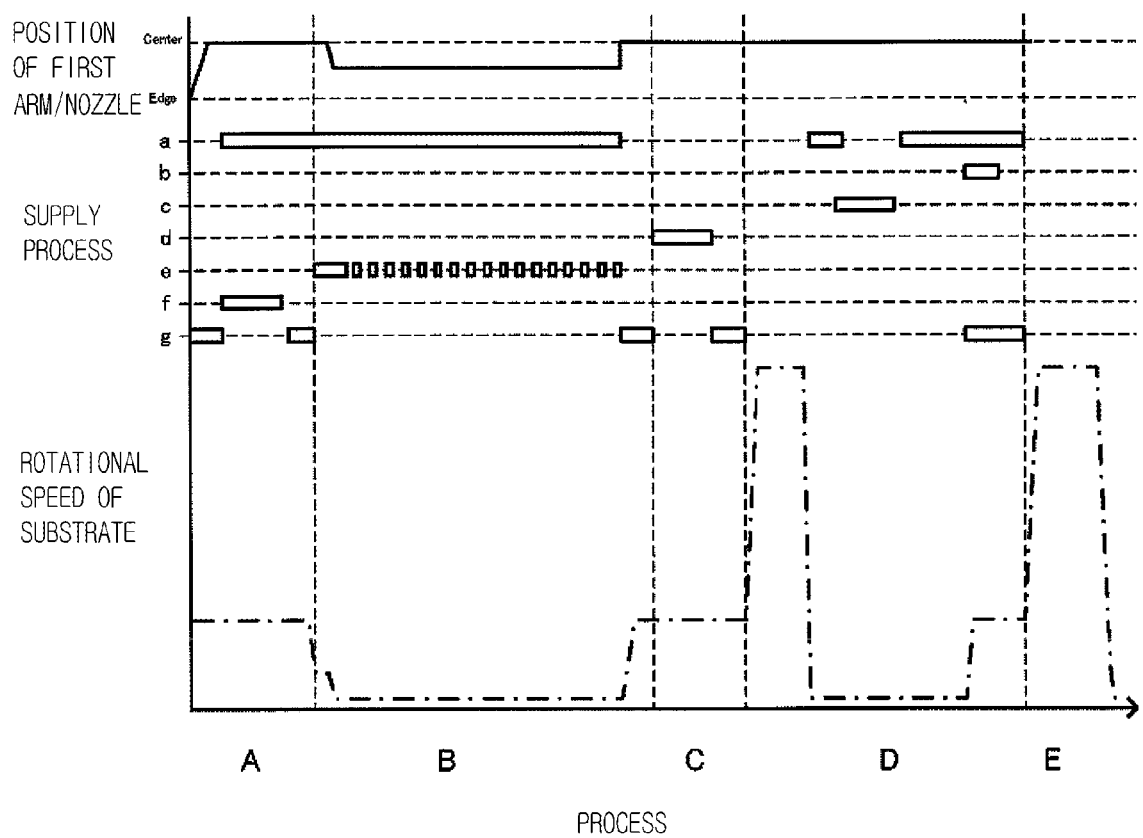
FIG. 7 sets forth a diagram for describing an entire process of the electroless plating unit in accordance with the embodiment of the present disclosure.
Figure 8:
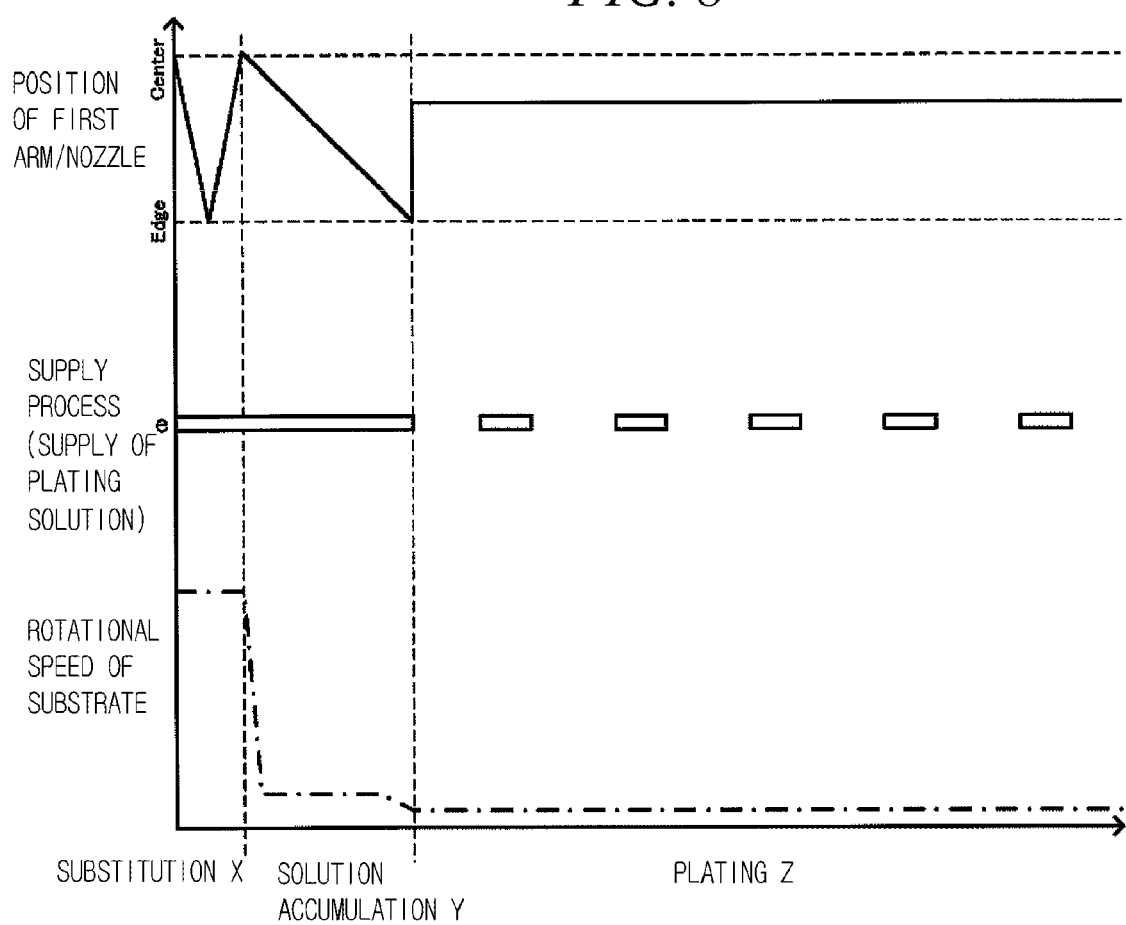
FIG. 8 presents a diagram for describing a plating process of the electroless plating unit in accordance with the embodiment of the present disclosure.

Now, the operation of the electroless plating unit 11 in accordance with the present embodiment will be described with reference to FIGS. 1 to 8. FIG. 6 provides a flowchart to describe the operation of the electroless plating unit 11 in accordance with the present embodiment, especially, a plating process operation thereof. FIG. 7 illustrates an entire process sequence of the electroless plating unit 11, and FIG. 8 illustrates a process sequence of the plating process of the electroless plating unit 11 in accordance with the present embodiment. As shown in FIG. 6, the plating unit 11 in accordance with the present embodiment performs five processing steps including a pre-cleaning process ("A" in the figure), a plating process ("B" in the figure), a post-cleaning process ("C" in the figure), a rear surface/end surface cleaning process ("D" in the figure) and a drying process ("E" in the figure). Further, as shown in FIG. 7, the plating unit 11 performs seven supply processes of processing liquids including a rear surface pure water supply a for supplying heated pure water to the rear surface of the substrate; an end surface cleaning b for cleaning the end surface of the substrate; a rear surface cleaning c for cleaning the rear surface of the substrate; a post-cleaning d for cleaning the substrate after a plating process; the plating process e; a pre-cleaning f for cleaning the substrate prior to the plating process; and a pure water supply g for controlling the hydrophilicity of the substrate W. FIG. 8 shows the processing sequence of the plating process e shown in FIG. 7 in further detail.

The first substrate transfer mechanism 9 takes substrate W sheet by sheet from the FOUP F of the loading/unloading unit 1 and loads each substrate W into the transfer unit 10 of the processing unit 2. Once the substrate W is loaded, the second substrate transfer mechanism 14 transfers the substrate W into the heating unit 12 and the cooling unit 13 in which the substrate W is processed by a heat treatment therein. Upon the completion of the heat treatment, the second substrate transfer mechanism 14 transfers the substrate W into the electroless plating unit 11.

First, the process controller 51 carries out the pre-cleaning process A. The pre-cleaning process A includes a hydrophilicizing process, a pre-cleaning process, and a pure water process.

The process controller 51 rotates the substrate W held on the spin chuck 130 by driving the motor 135. If the spin chuck 130 is rotated, the process controller 51 instructs the nozzle driving device 205 to drive the first fluid supply unit 140. The nozzle driving device 205 moves the first arm 142 to a preset position on the substrate W (e.g., a position at which the nozzle 144a is located at the center of the substrate W) by operating the first rotation driving mechanism 143. Further, the nozzle driving device 205 also moves the second arm 152 to a periphery portion of the substrate W by operating the second rotary driving mechanism 153. When the two arms reach their preset positions, the process controller 51 instructs the fluid supply device 200 to perform the hydrophilicizing process (S301). Then, the fluid supply device 200 supplies a preset amount of pure water $L_0$ into the nozzle 144a by opening the valve 260a (supply process g in FIG. 7). At this time, the nozzle 144a is located above the substrate W by, e.g., about 0.1 to 20 mm. Likewise, the fluid supply unit 200 supplies the processing liquid $L_4$ into the nozzle 154 by opening the valve 243. In this process, as the processing liquid $L_4$, one capable of obtaining a hydrophilicizing effect different from that of the pure water $L_0$ is employed. This hydrophilicizing process prevents the pre-cleaning solution to be supplied in the subsequent pre-cleaning process from splashing off the surface of the substrate W and also suppresses the plating solution from being dropped off the surface of the substrate W.

Subsequently, the process controller 51 instructs the fluid supply device 200 to perform the pre-cleaning process (supply process f in FIG. 7) and the heated pure water supply to the rear surface (supply process a in FIG. 7). The fluid supply device 200 stops the supply of the pure water $L_0$ by closing the valve 260a and stops the supply of the processing solution $L_4$ by closing the valve 243, and supplies the pre-cleaning processing solution $L_1$ into the nozzle 144a by driving the pump 212 and the valve 213 (S303). Here, since the nozzle 144a is moved to the almost central position of the substrate W, the nozzle 144a becomes to supply the pre-cleaning solution $L_1$ toward the almost central portion of the substrate W. Since organic acid or the like is used as the pre-cleaning processing solution, it can eliminate copper oxide from copper wiring without causing galvanic corrosion, thereby increasing nucleation density in the plating process.

Thereafter, the fluid supply device 200 supplies the pure water to the fluid supply path 171. The heat exchanger 175 controls the temperature of the pure water sent into the fluid supply path 171 and supplies the temperature-controlled pure water to the bottom surface of the substrate W via the flow path 166 provided in the back plate 165, whereby the temperature of the substrate W is maintained at a temperature adequate for the plating process. Further, almost the same effect as described can be obtained even if starting the supply of the pure water into the fluid supply path 171 simultaneously with the above-described step S303.

Upon the completion of the pre-cleaning process, the process controller 51 instructs the fluid supply device 200 to perform the pure water process (supply process g in FIG. 7) (S305). The fluid supply device 200 stops the supply of the pre-cleaning processing solution $L_1$ by operating the pump 212 and the valve 213, and sends a certain amount of pure water $L_0$ into the nozzle 144*a* by opening the valve 260*a*. Then, by the supply of the pure water $L_0$ from the nozzle 144*a*, the pre-cleaning processing solution is substituted with the pure water. Through this pure water process, a generation of a process error due to the mixing of the acid pre-cleaning processing solution $L_1$ with the alkaline plating processing solution can be prevented.

After the pre-cleaning process A, the process controller 51 performs the plating process B. The plating process B includes a plating solution substitution process, a plating solution accumulation process, a plating solution process, and a pure water process.

The process controller 51 instructs the fluid supply device 200 and the nozzle driving device 205 to perform the plating solution substitution process (supply process e in FIG. 7). The fluid supply device 200 stops the supply of the pure water $L_0$ by closing the valve 260*a*, and supplies the plating solution $L_3$ into the nozzle 144*c* by operating the pump 232 and the valve 233. Meanwhile, the nozzle driving device 205 operates the first rotation driving mechanism 143 to thereby rotate the first arm 142 such that the nozzle 144*c* is moved (scanned) from the central portion of the substrate W to the periphery portion thereof and then back to the central portion again (S312). In the plating solution substitution process, the plating solution supply nozzle is moved from the central portion of the substrate W to the periphery portion thereof and then back to the central portion, and the substrate W is rotated at a relatively high rotational speed ("substitution X" process in FIG. 8). By this operation, the plating solution $L_3$ is diffused onto the substrate W, so that it becomes possible to rapidly substitute the pure water on the surface of the substrate W with the plating solution.

Upon the completion of the plating solution substitution process, the process controller 51 reduces the rotational speed of the substrate W held on the spin chuck 130, and instructs the fluid supply device 200 and the nozzle driving device 205 to perform the plating solution accumulation process. The fluid supply device 200 keeps on supplying the plating solution $L_3$, and the nozzle driving device 205 operates the first rotation driving mechanism 143, whereby the nozzle 144*c* is slowly moved from the central portion of the substrate W toward the periphery portion thereof (S314). The surface of the substrate W treated by the plating solution substitution process is covered with a sufficient amount of plating solution $L_3$. Further, when the nozzle 144*c* approaches close to the vicinity of the periphery portion of the substrate W, the process controller 51 further reduces the rotational speed of the substrate W ("solution accumulation Y" process in FIG. 8).

Subsequently, the process controller 51 instructs the fluid supply device 200 and the nozzle driving device 205 to perform the plating process. The nozzle driving device 205 operates the first rotation driving mechanism 143 to thereby rotate the first arm 142 so as to locate the nozzle 144*c* at an almost midway position between the central portion and the periphery portion of the substrate W.

Then, the fluid supply device 200 supplies the plating solution $L_3$ into the nozzle 144*c* discontinuously or intermittently by operating the pump 232 and the valve 233 (S317). That is, as illustrated in a "plating Z" process in FIGS. 7 and 8, the nozzle is located at a preset position and the plating solution is supplied discontinuously or intermittently. Since the substrate W is being rotated, the plating solution $L_3$ can be widely diffused onto the entire region of the substrate W even if it is supplied discontinuously (intermittently).

At this time, the process controller 51 instructs the nozzle driving device 205 to locate the agitation member 155 at a preset position. The nozzle driving device 205 operates the second rotation driving mechanism 153 and rotates the second arm 152 so as to locate the agitation member 155 at the periphery portion of the substrate W. As a result, the leading end portion of the agitation member 155 is made to come into contact with the surface of the plating processing solution $L_3$ while agitating it.

Further, the processes of the steps S312, S314 and S317 may be performed repetitively. After a lapse of a predetermined time period after the supply of the plating solution $L_3$ is begun, the fluid supply device 200 stops the supply of the plating solution $L_3$, and the process controller 51 stops the supply of the heated pure water to the rear surface of the substrate W. Further, the nozzle driving device 205 rotates the second arm 152 based on an instruction from the process controller 51 to thereby retreat the agitation member 155 from the periphery portion of the substrate W.

In the plating process B, in response to an instruction from the process controller 51, the fluid supply device 200 supplies the plating solution $L_3$ into the nozzle 144*c* by operating a supply mechanism. The supply mechanism conducts a transport control of the plating solution such that the pipe 141*c* inside a heat insulator and a temperature controller is filled up with the plating solution and the plating solution does not drop down from the nozzle 144*c*. A re-suction mechanism sucks the supplied plating solution, thus preventing the plating solution from dropping down from the nozzle 144*c*.

Further, the process controller 51 instructs the fluid supply device 200 and the nozzle driving device 205 to perform the pure water process (supply process g in FIG. 7). The process controller 51 increases the rotational speed of the substrate W held on the spin chuck 130, and the nozzle driving device 205 operates the first rotation driving mechanism 143 to thereby rotate the first arm 142 so as to locate the nozzle 144*c* at the central portion of the substrate W. Thereafter, the fluid supply device 200 supplies the pure water $L_0$ by opening the valve 260*a* (S321). In this way, the plating solution left on the surface of the substrate W is eliminated so that the plating solution can be prevented from being mixed with a post-processing solution.

After the plating process B, the process controller 51 conducts the post-cleaning process C. The post-cleaning process C includes a post chemical solution treatment and a pure water process.

The process controller 51 instructs the fluid supply device 200 to perform the post chemical solution treatment (supply process d in FIG. 7). The fluid supply device 200 stops the supply of the pure water $L_0$ by closing the valve 260a, and supplies the post-cleaning processing solution $L_2$ into the nozzle 144b by operating the pump 222 and the valve 223 (S330). The post-cleaning processing solution $L_2$ functions to remove residues on the surface of the substrate W or an abnormally precipitated plated film.

After the post chemical solution treatment, the process controller 51 instructs the fluid supply device 200 to perform the pure water process (supply process g in FIG. 7). The fluid supply device 200 stops the supply of the post-cleaning processing solution $L_2$ by operating the pump 222 and the valve 223, and supplies the pure water $L_0$ by opening the valve 260b (S331).

After the post-cleaning process C, the process controller 51 performs the rear surface/end surface cleaning process D. The rear surface/end surface cleaning process D includes a liquid removing process, a rear surface cleaning process and an end surface cleaning process.

The process controller 51 instructs the fluid supply device 200 to perform the liquid removing process. The fluid supply device 200 stops the supply of the pure water $L_0$ by closing the valve 260b, and the process controller 51 increases the rotational speed of the substrate W held on the spin chuck 130. This process aims at removing the liquid on the surface of the substrate W by drying the surface of the substrate W.

After the completion of the liquid removing process, the process controller 51 instructs the fluid supply device 200 to perform the rear surface cleaning process. First, the process controller 51 decreases the rotational speed of the substrate W held on the spin chuck 130. Thereafter, the fluid supply device 200 supplies pure water into the fluid supply path 171 (supply process a in FIG. 7). The heat exchanger 175 controls the temperature of the pure water sent to the fluid supply path 171 and supplies the temperature-controlled pure water to the rear surface of the substrate W via a flow path provided in the back plate 165 (S342). The pure water functions to hydrophilicize the rear surface side of the substrate W. Subsequently, the fluid supply device 200 stops the supply of the pure water into the fluid supply path 171, and instead supplies a rear surface cleaning solution into the fluid supply path 171 (S343). The rear surface cleaning solution functions to wash away and remove residues on the rear surface side of the substrate W in the plating process (supply process c in FIG. 7).

Thereafter, the process controller 51 instructs the fluid supply device 20 and the nozzle driving device 205 to perform the end surface cleaning process. The fluid supply device 200 stops the supply of the rear surface cleaning solution into the rear surface of the substrate W and instead supplies pure water, the temperature of which is controlled by the heat exchanger 175, into the fluid supply path 171 (S344) (supply process a in FIG. 7).

Subsequently, the nozzle driving device 205 rotates the second arm 152 so as to locate the nozzle 154 at an edge portion of the substrate W by means of driving the second rotation driving mechanism 153, and the process controller 51 increases the rotational speed of the substrate W up to about 150 to 300 rpm. Likewise, the nozzle driving device 205 rotates the first arm 142 so as to locate the nozzle 144b at the central portion of the substrate W by means of operating the first rotation driving mechanism 143. The fluid supply device 200 supplies the pure water $L_0$ into the nozzle 144b by opening the valve 260b, and supplies the outer periphery processing solution $L_4$ into the nozzle 154 by operating the pump 242 and the nozzle 243 (supply processes a and g in FIG. 7). That is, in this state, the pure water $L_0$ and the outer periphery processing solution $L_4$ are supplied to the central portion and the edge portion of the substrate W, respectively, while the temperature-controlled pure water is supplied to the rear surface of the substrate W (S346).

After the rear surface/end surface cleaning process D, the process controller 51 performs the drying process E. The drying process E includes a drying step.

The process controller 51 instructs the fluid supply device 200 and the nozzle driving device 205 to perform the drying step. The fluid supply device 200 stops the supply of all the processing solutions, and the nozzle driving device 205 retreats the first arm 142 and the second arm 152 from above the substrate W. Further, the process controller 51 increases the rotational speed of the substrate W up to about 800 to 1000 rpm to thereby dry the substrate W (S351). After the completion of the drying step, the process controller 51 stops the rotation of the substrate W. After the plating process is completed, the transfer arm 14A of the second substrate transfer mechanism 14 takes out the substrate W from the spin chuck 130 via the window 115.

Further, the process sequences of the pre-cleaning process, the plating process, the post-cleaning process, the rear surface/end surface cleaning process, and the drying process; the sequence of supplying or driving operations by the nozzle driving device 205, a temperature control fluid supply device 450 and the like; and the operation sequence of the various valves and pumps are all stored in the storage unit 53, and the process controller 51 sends instructions to each component to operate and control them based on the corresponding stored information.

Figure 9:
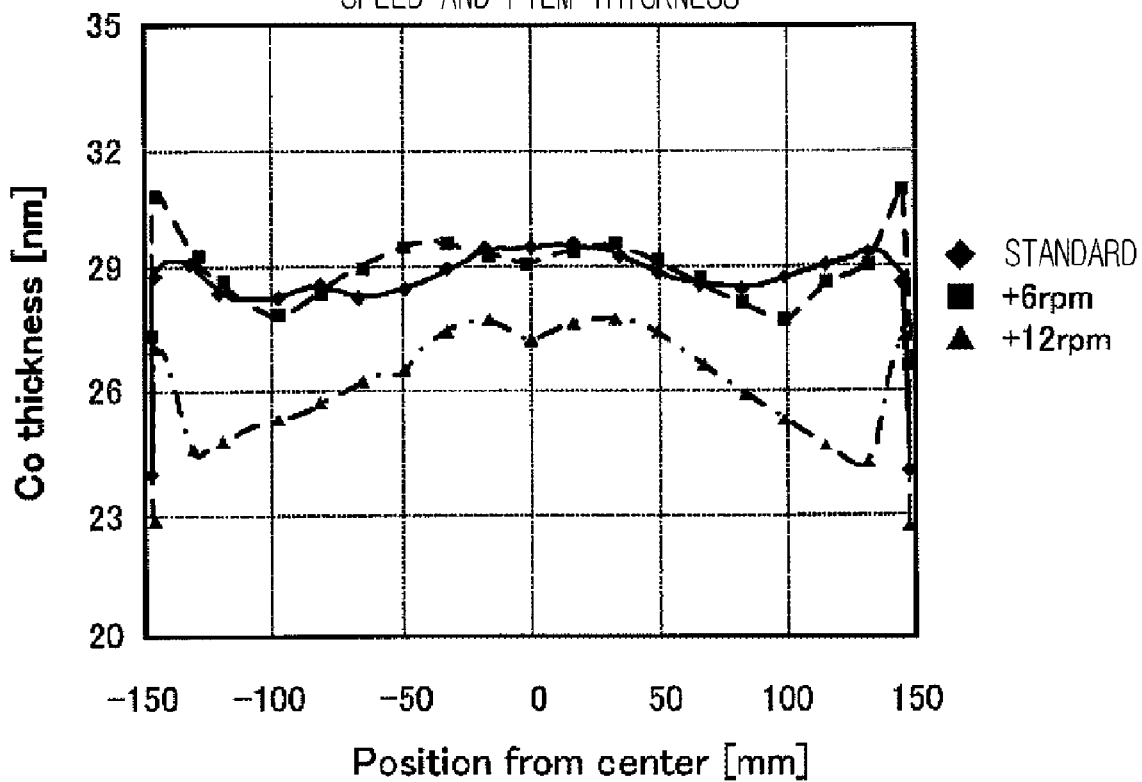
FIG. 9 depicts a diagram for describing a relationship between a rotation speed and a film thickness of a plated film in the plating process.
Figure 10:
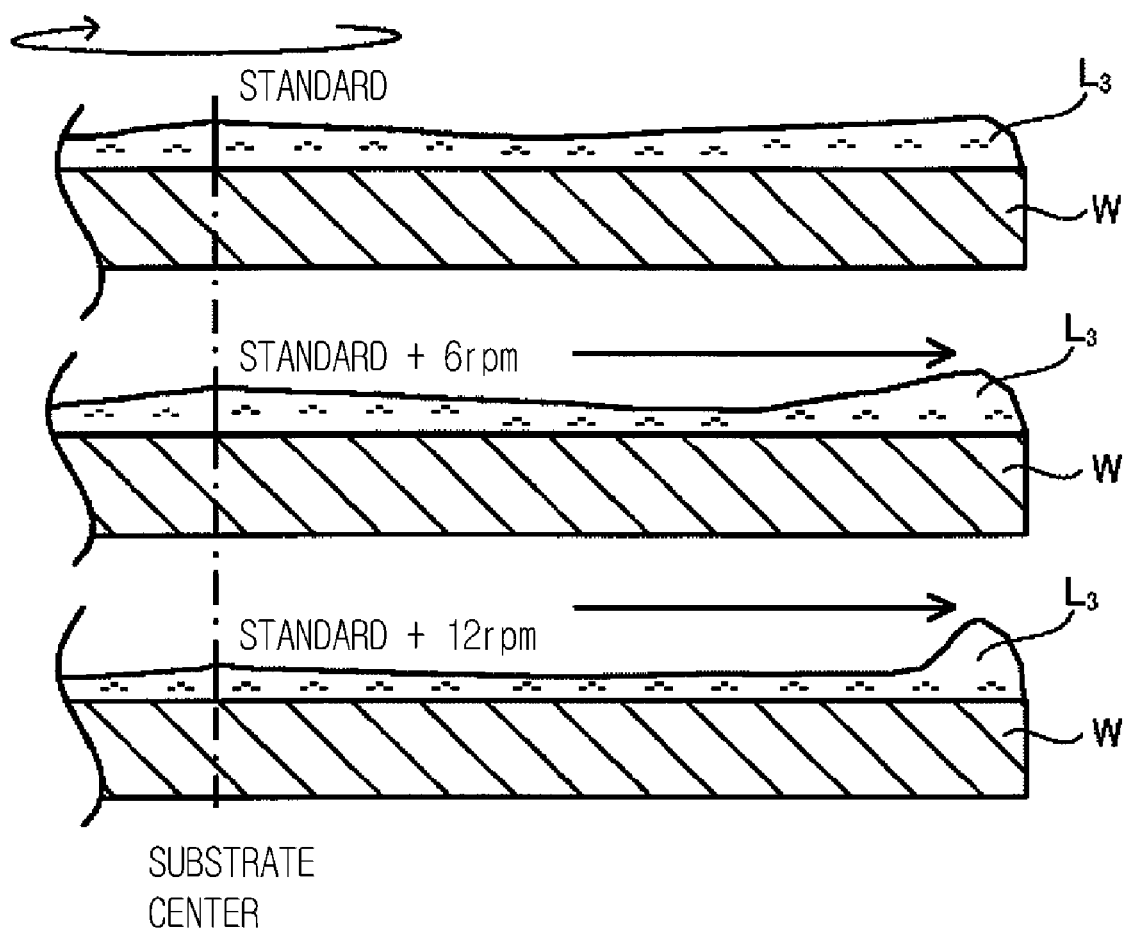
FIG. 10 offers a diagram for describing a rotation speed and a surface state of a substrate in the plating process.

Now, referring to FIGS. 9 and 10, the function of the agitation member 155 in the present embodiment will be elaborated. FIG. 9 is a chart showing a relationship between a rotational speed and a plated film thickness in the plating process, and FIG. 10 is a chart showing a relationship between the rotational speed and the surface state of the substrate W.

As stated above, the delay of the formation of the plated film at the periphery portion of the substrate W may be resulted from non-uniformity of the plating process itself or variation of plating temperature on the surface of the substrate W. Such non-uniformity or variation is deemed to be caused because the amount of the plating solution on the substrate W at the periphery portion of the substrate W becomes relatively smaller than that on the central portion of the substrate W. Here, an experiment was conducted in which the amount of the plating solution on the periphery portion of the substrate W is increased intentionally, and its effect on a film forming rate was investigated.

A typical plating process was conducted at three rotational speeds: a standard speed, a standard speed plus 6 rpm, and a standard speed plus 12 rpm. Results of this experiment were provided in FIG. 9, and states of the plating processing solution on the processing surface of the substrate W at this time are shown in FIG. 10. As illustrated in FIG. 9, though the thickness of a plated film was about 29±1 nm in the plating process by the standard speed, it was observed that the thickness of the plated film slightly increases at a position of about 140 mm from the substrate center and rapidly decreases in the range from about 140 to 150 mm from the substrate center. This is deemed to be resulted because the end of the plating processing solution becomes roundish due to its surface tension and the plating processing solution is not sufficiently supplied in the substrate edge portion (about 150 mm from the center of the substrate).

Meanwhile, in both cases of increasing the rotational speed higher than the standard speed (increases of 6 rpm and 12 rpm), enhancement of plated film formation (film thickness)

was observed at the periphery portion of the substrate in comparison with the case of using the standard speed. That is, though the film thickness greatly decreases at positions of about 100 mm (increase of 6 rpm) and about 140 mm (increase of 12 rpm) from the substrate center, a peak of film thickness can be obtained at the substrate edge portion. This is deemed to be possible because the plating processing solution is moved toward the substrate edge portion due to a centrifugal force and sufficiently supplied in the substrate edge portion (periphery portion). However, in the case of increasing the rotational speed by 12 rpm, the film formation rate of the plated film entirely decreases (about 26 nm). This is deemed to be because the time period during which the plating processing solution stays on the substrate is short due to the increase of the rotational speed of the substrate. The enhancement in the thickness of the plated film at the substrate periphery portion coincides with the accumulation of the plating processing solution at the periphery portion of the substrate W shown in FIG. 10. That is, an amount of the plating processing solution accumulated on the substrate W is correlated with the plated film thickness.

This is deemed to be related to a heat capacity of the plating processing solution. That is, at a place where the amount of the plating processing solution accumulated on the substrate is large, the amount of heat applied from the plating processing solution to the substrate becomes relatively great, so that a reduction of the substrate temperature by heat dissipation becomes smaller than that at a place where the amount of the plating processing solution accumulated thereon is small. Since the temperature of the plating processing solution is controlled at the temperature level suitable for the film formation, the reduction of the substrate temperature may have an adverse influence on the film formation. Thus, for the uniform formation of the plated film on the substrate surface, it can be said that it is effective to uniform the amount of the solution accumulated on the substrate.

As stated above, the surface of the plating processing solution tends to be rounded at the substrate periphery portion due to the surface tension of the plating solution, and an amount of the solution accumulated on the substrate tends to decrease thereon. These tendencies correspond to the decrease of the plated film thickness at the substrate periphery portion in the case of the standard speed of FIG. 9. To increase the supply of the plating processing solution in the substrate edge portion, it can be considered to use a centrifugal force obtained by increasing the rotational speed of the substrate. If the rotational speed of the substrate is increased, the peak of thick film thickness is obtained at the substrate edge portion as illustrated in FIG. 9 whereas a peak having a thin film thickness may also appear. Further, as in the case of increasing the rotational speed by 12 rpm shown in FIG. 9, the film forming rate may be entirely deteriorated. However, in the plating unit in accordance with the present embodiment, the amount of the plating processing solution accumulated on the substrate periphery portion is relatively increased by allowing the agitation member 155 to come into contact with the plating processing solution at the substrate periphery portion. With this method, the supply of the plating processing solution at the substrate edge portion can be maintained without causing an appearance of a peak having a thin film thickness, and uniform plated film formation on the entire substrate surface can be accomplished. In case of the standard speed, it may be desirable to place the agitation member 155 at a position closer to the substrate edge portion than a position where the film thickness decreases rapidly (in the example shown in FIG. 9, a position no greater than about 10 mm away from the edge side of the substrate, i.e., the edge of the substrate W from a position of about 140 mm).

Figure 11:
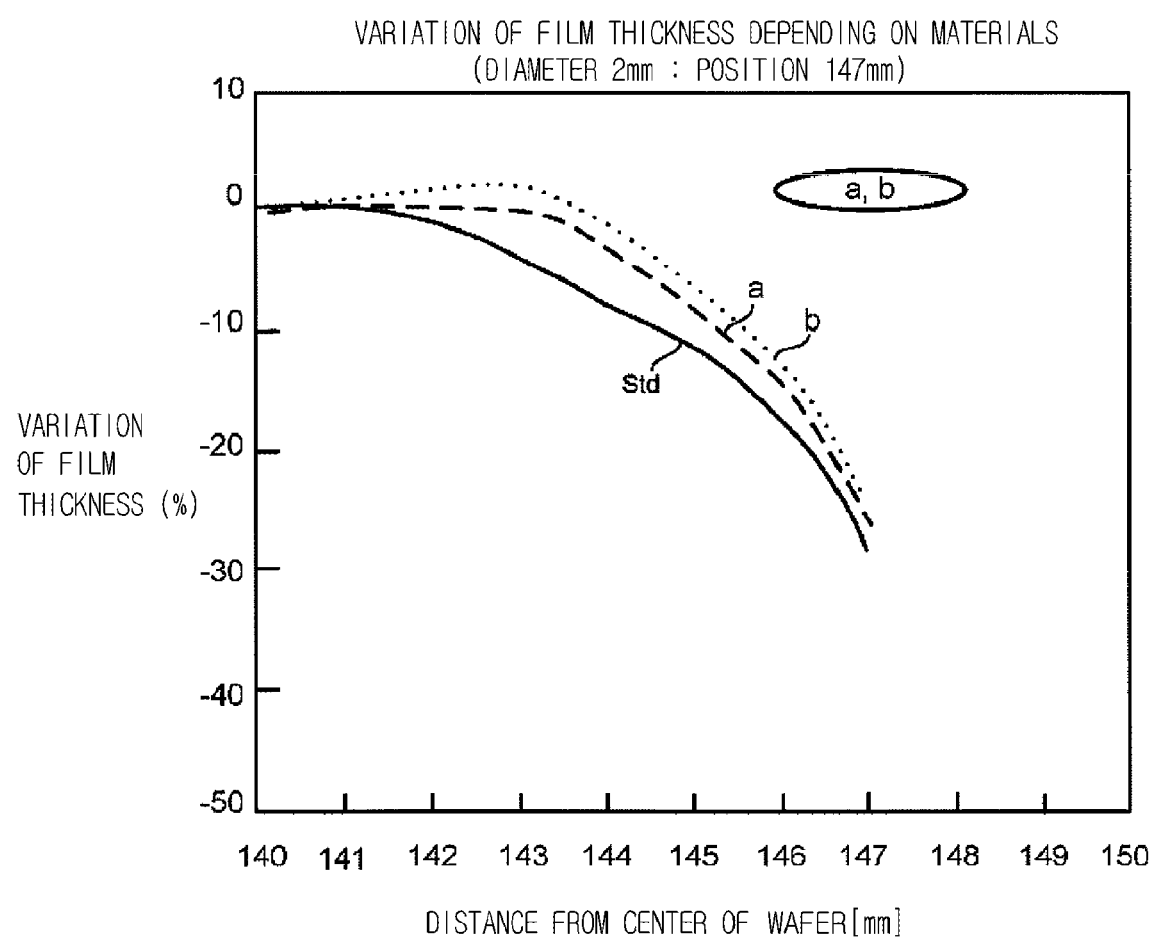
FIG. 11 is a diagram for describing a variation of a film thickness depending on a material of an agitating member in accordance with the embodiment of the present disclosure.
Figure 12:
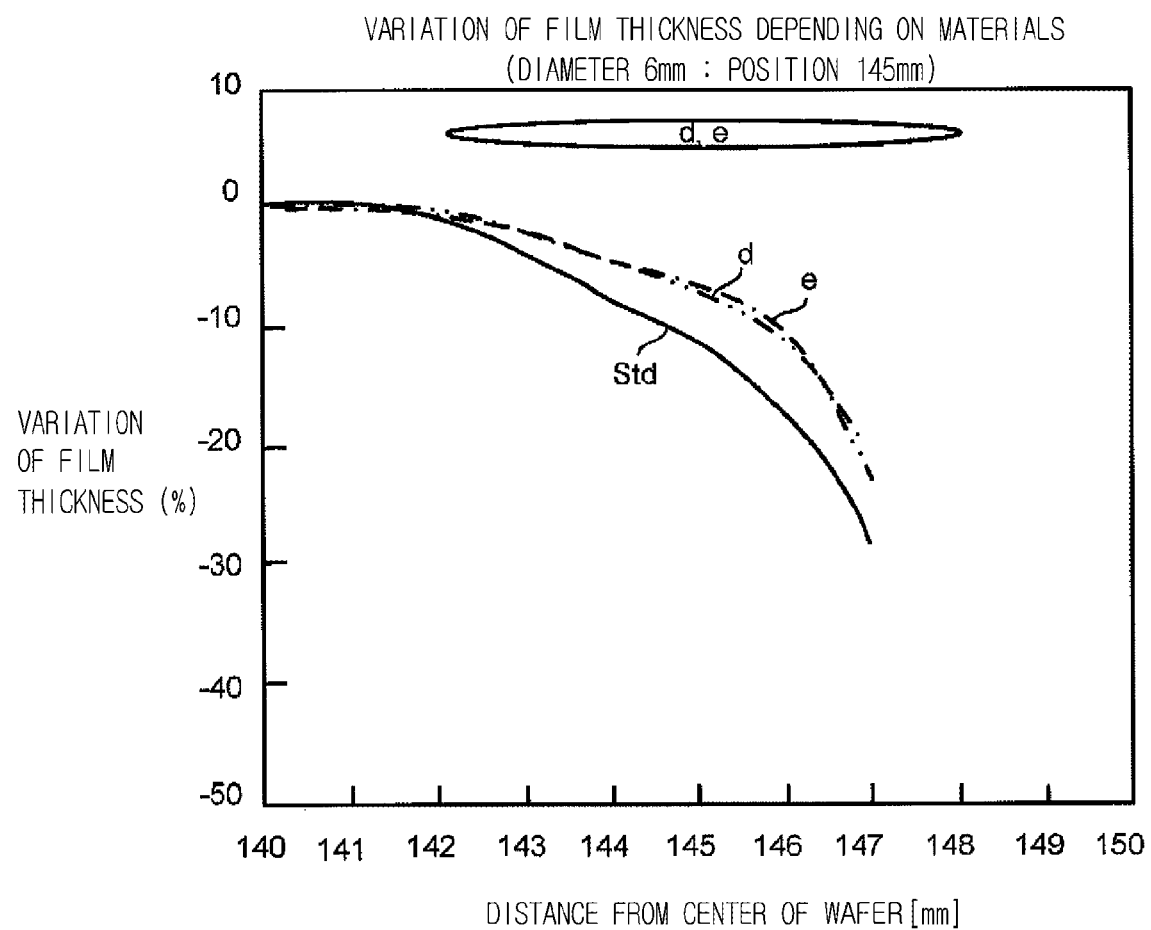
FIG. 12 provides another diagram for describing a diagram for describing a variation of a film thickness depending on the material of the agitating member in accordance with the embodiment of the present disclosure.

Now, relationships between the material, the installation position and the diameter of the agitation member will be explained with reference to FIGS. 11 to 15. FIGS. 11 and 12 show variations of the plated film thickness depending on the material of the agitation member, while FIGS. 13 to 15 show variations of the plated film thickness depending on the position of the agitation member.

As for a wafer having a diameter of about 300 mm, a plating process was conducted under general plating conditions for each of cases of using no agitation member 155 ("std" in the figures); using an agitation member made of a hydrophobic material having a diameter of about 2 mm and disposed about 147 mm away from the substrate center ("a" in the figure); using an agitation member made of a hydrophilic material having a diameter of about 2 mm and disposed about 147 mm away from the substrate center ("b" in the figure); using an agitation member made of a hydrophobic material having a diameter of about 6 mm and disposed about 144 mm away from the substrate center ("c" in the figure); using an agitation member made of a hydrophobic material having a diameter of about 6 mm and disposed about 145 mm away from the substrate center ("d" in the figure); and using an agitation member made of a hydrophilic material having a diameter of about 6 mm and disposed about 145 mm away from the substrate center ("e" in the figure), and variations of the film thickness were investigated. Further, an ellipse in the figure indicates relationship between a distance from the center of wafer and a position of the agitation member. That is, the ellipse of FIG. 11 indicates that the agitation member having a diameter of 2 mm occupies a range of about 146 mm to 148 mm from the center of wafer on the substrate.

As illustrated in FIG. 11, as for the agitation member having the diameter of 2 mm, the variation of the film thickness was smaller and more uniform film formation on the substrate surface can be obtained in the case of the hydrophilic material ("b") than in the case of the hydrophobic material ("a"). Meanwhile, as shown in FIG. 12, in all cases of using the agitation member having the diameter of 6 mm, better film formation was obtained in comparison with the case without using the agitation member, but there was observed an unsubstantial difference between the hydrophobic material and the hydrophilic material. FIG. 13 illustrates a case of varying the location of the agitation member made of the hydrophobic material having the diameter of 6 mm, and it shows that a better result could be obtained when locating the agitation member closer to the substrate periphery portion ("d" in the figure).

FIG. 14 illustrates a case of varying the diameter (and placement position) of an agitation member made of a hydrophobic material, and it shows that a better result could be obtained at the substrate periphery portion when using the agitation member having a larger diameter. FIG. 15 illustrates a case of varying the diameter (and placement position) of an agitation member made of a hydrophilic material, and it shows that a better result can be obtained at the substrate periphery portion when using the agitation member having a larger diameter, as in the case of FIG. 14.

From the above-stated results, it can be found that a better result can be obtained by using an agitation member having a larger diameter, and it is desirable to locate the agitation member close to the substrate periphery portion.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention. The scope of the present invention is defined by the following claims rather than by the detailed description of the embodiment. It shall be understood that all modifications and embodiments conceived from the meaning and scope of the claims and their equivalents are included in the scope of the present invention.

INDUSTRIAL APPLICABILITY

The present invention has many advantages when it is employed in the field of semiconductor manufacture.

What is claimed is:

1. A method for forming a cap metal on a copper wiring formed on a processing target surface of a substrate, the method comprising:
    holding the substrate so as to be rotatable;
    rotating the substrate in a processing target surface direction of the substrate;
    locating an end portion of an agitation member so as to face the processing target surface of a periphery portion of the substrate with a preset gap maintained therebetween;
    supplying a plating processing solution onto the processing target surface;
    moving the agitation member such that the end portion of the agitation member comes into contact with a surface of the plating processing solution that is supplied; and
    stopping the supply of the plating processing solution and moving the agitation member such that the end portion of the agitation member is separated away from the processing target surface of the substrate,
    wherein the agitation member functions to lift up the surface of the plating process solution flowing on the periphery portion of the substrate, thereby allowing the plating process solution on the periphery portion of the substrate to become thicker.

2. The method of claim 1, wherein the end portion of the agitation member is located at a position about 10 mm away from an edge of the substrate.

3. The method of claim 1, wherein the end portion of the agitation member is located to have the gap smaller than a gap at which the end portion of the agitation member is in contact with the surface of the plating processing solution that is supplied.

4. The method of claim 1, wherein the end portion of the agitation member is made of a hydrophilic material.

5. The method of claim 1, wherein the end portion of the agitation member is formed in a circular cross section having a diameter of about 2 mm or greater.

* * * * *